US011195268B2

(12) United States Patent
Kumar et al.

(10) Patent No.: US 11,195,268 B2
(45) Date of Patent: Dec. 7, 2021

(54) TARGET SELECTION IMPROVEMENTS FOR BETTER DESIGN ALIGNMENT

(71) Applicant: KLA-TENCOR CORPORATION, Milpitas, CA (US)

(72) Inventors: Santosh Kumar, Milpitas, CA (US); Pavan Kumar Perali, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 182 days.

(21) Appl. No.: 16/117,383

(22) Filed: Aug. 30, 2018

(65) Prior Publication Data
US 2019/0362489 A1 Nov. 28, 2019

Related U.S. Application Data

(60) Provisional application No. 62/675,126, filed on May 22, 2018.

(51) Int. Cl.
| | |
|---|---|
| *G06T 7/00* | (2017.01) |
| *G01N 23/2251* | (2018.01) |
| *H01L 21/66* | (2006.01) |
| *H01L 21/027* | (2006.01) |

(52) U.S. Cl.
CPC ....... *G06T 7/0006* (2013.01); *G01N 23/2251* (2013.01); *G01N 2223/6116* (2013.01); *G06T 2207/10061* (2013.01); *G06T 2207/20021* (2013.01); *G06T 2207/30148* (2013.01); *H01L 21/027* (2013.01); *H01L 22/12* (2013.01); *H01L 22/30* (2013.01)

(58) Field of Classification Search
CPC ......... G06T 7/0006; G06T 2207/10061; G06T 2207/30148; G06T 2207/20021; G01N 23/2251
See application file for complete search history.

(56) References Cited

U.S. PATENT DOCUMENTS

| | | | |
|---|---|---|---|
| 8,434,030 B1 | 4/2013 | Hou et al. | |
| 2005/0004774 A1* | 1/2005 | Volk | G03F 1/84 |
| | | | 702/108 |
| 2005/0033528 A1* | 2/2005 | Toth | H01L 22/20 |
| | | | 702/35 |
| 2006/0269120 A1 | 11/2006 | Nehmadi et al. | |
| 2007/0071304 A1* | 3/2007 | Kuchii | G06T 7/0004 |
| | | | 382/141 |
| 2007/0230770 A1* | 10/2007 | Kulkarni | H01L 21/67005 |
| | | | 382/149 |

(Continued)

FOREIGN PATENT DOCUMENTS

| | | |
|---|---|---|
| JP | 2005283326 A | 10/2005 |
| KR | 20170129892 A | 11/2017 |

OTHER PUBLICATIONS

WIPO, ISR for PCT/US2019/030986, Aug. 27, 2019.

*Primary Examiner* — Jaime M Holliday
(74) *Attorney, Agent, or Firm* — Hodgson Russ LLP (57) ABSTRACT

Techniques and systems to achieve more accurate design alignment to an image by improved pixel-to-design alignment (PDA) target selection are disclosed. PDA targets in an image frame of a die can be biased to include a hotspot location in one of the PDA targets. The PDA targets can be evaluated for repetitive patterns by analyzing the uniqueness of the points used as the PDA targets.

18 Claims, 7 Drawing Sheets

(56) References Cited

U.S. PATENT DOCUMENTS

| | | | | |
|---|---|---|---|---|
| 2011/0285839 A1* | 11/2011 | Kotaki | ................... | G06T 7/001 |
| | | | | 348/80 |
| 2014/0198975 A1* | 7/2014 | Nakagaki | ........... | G01N 21/9501 |
| | | | | 382/149 |
| 2014/0270475 A1* | 9/2014 | Huang | ................... | G06T 7/001 |
| | | | | 382/149 |
| 2015/0062571 A1* | 3/2015 | Kulkarni | ................ | H01L 22/12 |
| | | | | 356/237.5 |
| 2016/0104600 A1 | 4/2016 | Luo et al. | | |
| 2019/0318471 A1* | 10/2019 | Chen | ....................... | G06T 7/001 |

\* cited by examiner

TARGET SELECTION IMPROVEMENTS FOR BETTER DESIGN ALIGNMENT

CROSS-REFERENCE TO RELATED APPLICATIONS

This application claims priority to the provisional patent application filed May 22, 2018 and assigned U.S. App. No. 62/675,126, the disclosure of which is hereby incorporated by reference.

FIELD OF THE DISCLOSURE

This disclosure relates to inspection of semiconductor wafers.

BACKGROUND OF THE DISCLOSURE

Evolution of the semiconductor manufacturing industry is placing ever greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

The interactions among the wafer printing process, wafer pattern, and inspection system is extremely complicated. Pixel-to-design alignment (PDA) is a design-based alignment methodology that can improve the defect location accuracy reported by an inspection tool, such as a scanning electron microscope (SEM). PDA accuracy can help with certain types of wafer inspections. However, design clips and wafer images have substantially different modalities. These problems make image rendering the most difficult task in PDA. Although a statistical algorithm may be used to mitigate the impact from an unsatisfactory image rendering to some extent and can provide a considerable cushion to the individual PDA misalignment, the need for individual PDA at the subpixel level for design clips that are difficult to render, such as the areas near SRAM areas, is inevitable.

Current PDA target selection is based on image salient features. Current PDA does not incorporate any design information. A landmark-based PDA has the ability to do target selection, but based only on predefined landmarks, which may be a special outline around array regions that are used to generate targets. This is applicable only to array based inspections. Thus, the PDA quality at logic care areas in not sufficient.

Design guided inspection methodology enhances sensitivity for the certain defect types by employing large number of tiny care areas from design, and inspecting them with the requisite coordinate accuracy. Design guided inspection helps inspect with smaller care areas by improving placement accuracy. The smaller care areas result in better separation between the regions of interest and nuisance. These care areas go through expansion steps in the system before being used for detection. Care area expansion can occur due to system specifications for placement accuracy or can occur due to PDA alignment errors.

Figure 1:
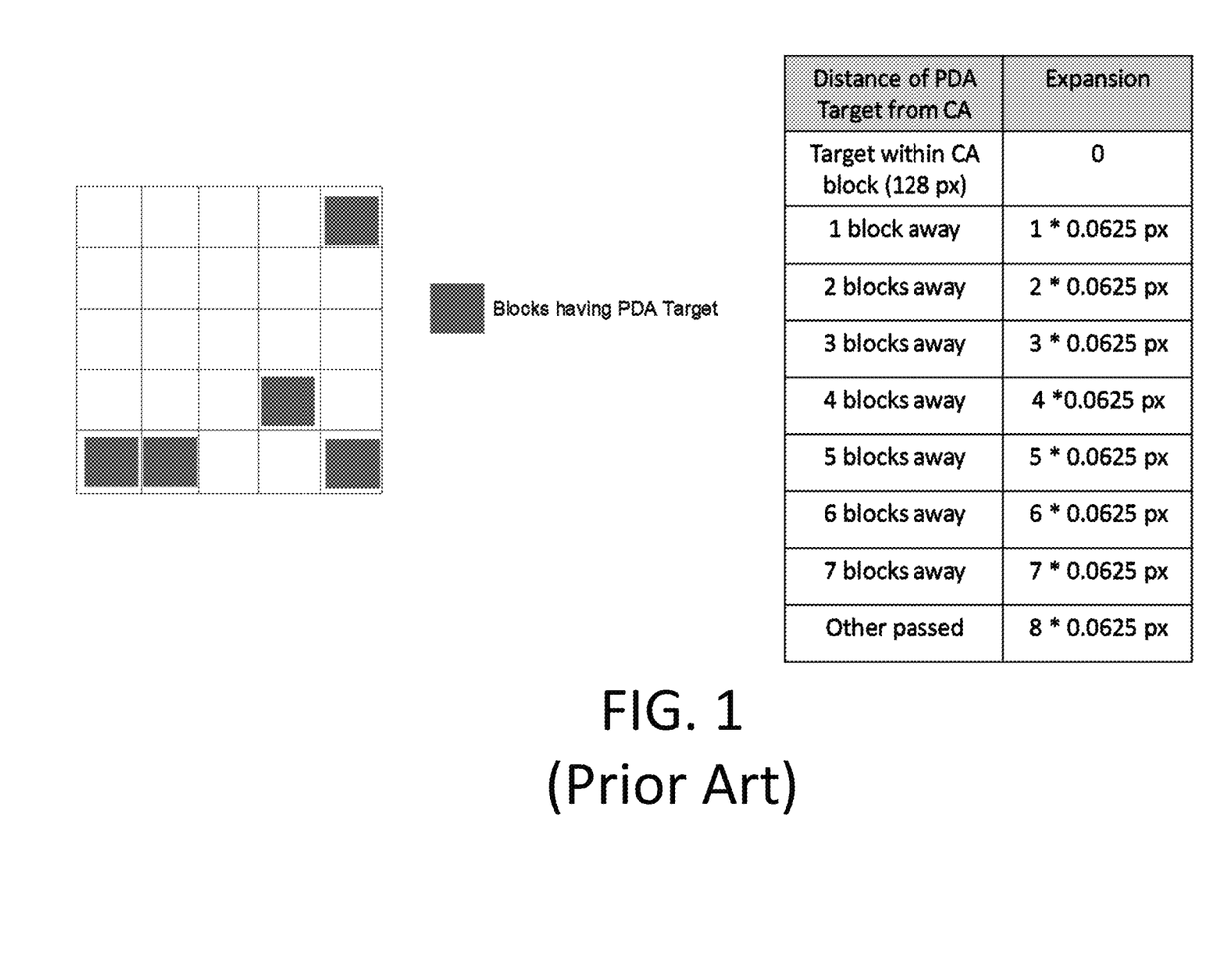
FIG. 1 is an exemplary frame of a die with PDA targets.

FIG. 1 is an exemplary frame of a die with PDA targets. A PDA target finding step can try to find five targets in every frame of the die. The frame is divided into 25 blocks. The PDA target finding step tries to choose a target from five blocks with good optical properties, such as contrast. This can be seen in FIG. 1. Care area (CA) expansion due to PDA alignment errors is dependent on the proximity of the PDA target close to the care areas. This value of pixels can be computed dynamically and the expansion amount can be seen in the table shown in FIG. 1 by pixel (px).

Figure 2:
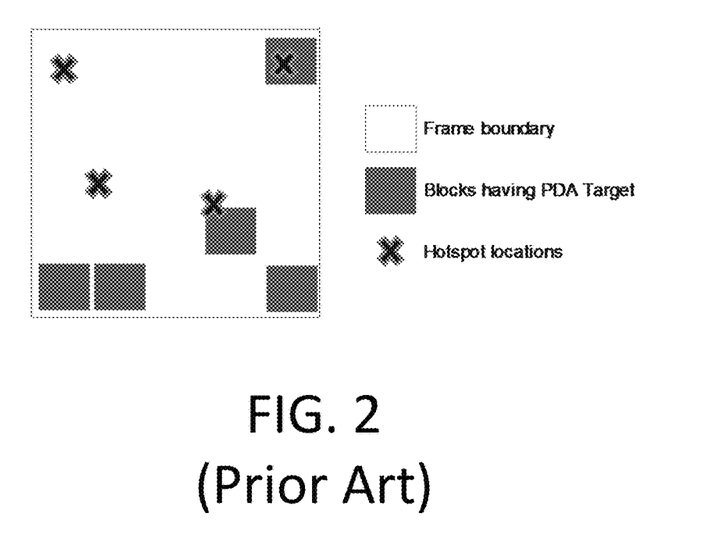
FIG. 2 is the exemplary frame of FIG. 1 relative to hotspots.

Hotspot care areas can be one of the most critical regions and are typically inspected with high sensitivity. Often, as seen in FIG. 2, PDA targets are not near the hotspot care areas in the majority of the frames. In the frame example of FIG. 2, some of the hotspots in the frame are far away from the PDA targets chosen based on optical properties. If hotspots are located far from the PDA targets, then hotspots may not be inspected or the PDA targets may not be selected to provide the best inspection.

Figure 3:
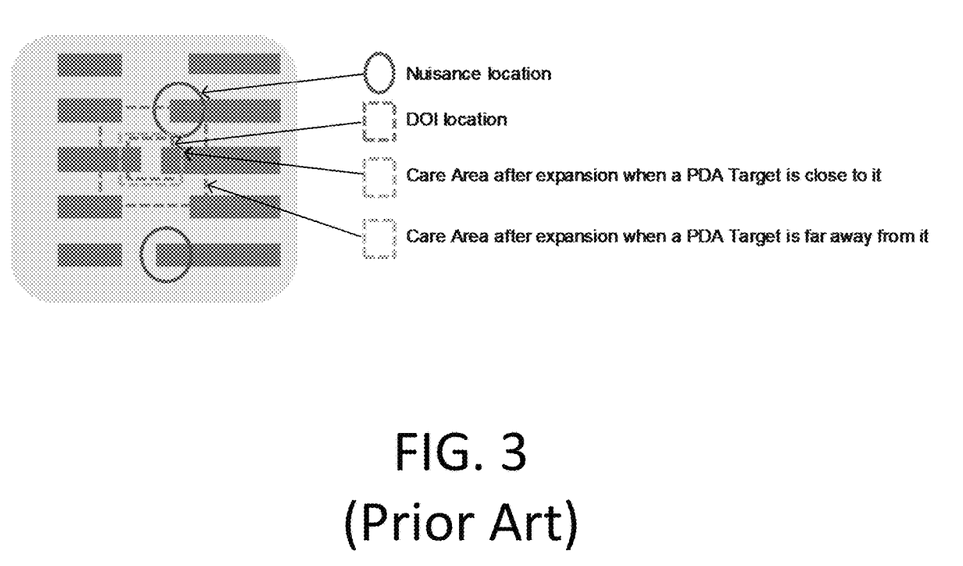
FIG. 3 is an example of care area expansion.

It is cost-prohibitive to select an entire image frame as a PDA area. Thus, care areas are expanded so PDA are not missed. As seen in FIG. 3, this results in increased care area expansion due to PDA alignment errors and possible loss of sensitivity to key defects of interest.

FIG. 3 is an example of defects of interest (DOI) from a contact CMP layer on N7 where nuisance pixels (i.e., at the nuisance locations) get into the care area because of expansion.

Care area expansion due to system specifications for placement accuracy is reduced with each new generation of inspection tools, so care area expansion due to PDA alignment errors will be a large contribution to the overall care area expansion.

Therefore, improved systems and techniques for inspection are needed.

BRIEF SUMMARY OF THE DISCLOSURE

A method is provided in a first embodiment. A hotspot location is received at a processor. Using the processor, pattern-to-design alignment targets in an image frame of a die are biased to include the hotspot location in one of the pattern-to-design alignment targets. Using the processor, the pattern-to-design alignment targets are evaluated for repetitive patterns.

The image frame may be divided into a plurality of regularly-sized blocks. For example, the image frame may be divided into twenty-five of the regularly-sized blocks.

The evaluating can include generating, using the processor, X and Y projections on the image frame; sampling, using the processor, a plurality of points with a highest gradient in both X and Y; creating, using the processor, target locations at a cross-section of the points; and evaluating, using the processor, uniqueness of the points. In an instance, the points are not unique, and the method can further include filtering the image frame with adaptive Fourier filtering using the processor. The method can further include selecting, using the processor, the points with maximum intensity as the pattern-to-design alignment targets.

All the pattern-to-design alignment targets can include a hotspot.

A non-transitory computer readable medium storing a program can be configured to instruct a processor to execute a variation of the method of the first embodiment.

A method is provided in a second embodiment. Using a processor, a pattern-to-design alignment target in an image frame is evaluated for repetitive patterns, wherein the pattern-to-design alignment target includes at least one hotspot location. Using the processor, X and Y projections on the image frame are generated. Using the processor, a plurality of points with a highest gradient in both X and Y are sampled. Using the processor, target locations are created at a cross-section of the points. Using the processor, uniqueness of the points are evaluated. The points are used as pattern-to-design alignment targets.

In an instance, the points are not unique, and the method can further include filtering the image frame with adaptive Fourier filtering using the processor. The method can further include selecting, using the processor, the points with maximum intensity as the pattern-to-design alignment targets.

A non-transitory computer readable medium storing a program can be configured to instruct a processor to execute a variation of the method of the second embodiment.

A system is provided in a third embodiment. The system includes a stage that holds a wafer; an electron beam source that directs an electron beam at the wafer; a detector configured to receive the electron beam reflected from the wafer; and a processor in electron communication with the detector. The processor is configured to receive a hotspot location; bias pattern-to-design alignment targets in an image frame of a die of the wafer to include the hotspot location in one of the pattern-to-design alignment targets; and evaluate the pattern-to-design alignment targets for repetitive patterns.

The image frame may be divided into a plurality of regularly-sized blocks. For example, the image frame may be divided into twenty-five of the regularly-sized blocks.

Evaluating the pattern-to-design alignment targets for the repetitive patterns can include generating X and Y projections on the image frame; sampling a plurality of points with a highest gradient in both X and Y; creating target locations at a cross-section of the points; and evaluating uniqueness of the points. In an instance, the points are not unique, and the processor can be further configured to filter the image frame with adaptive Fourier filtering. The processor can be further configured to select the points with maximum intensity as the pattern-to-design alignment targets.

All the pattern-to-design alignment targets may include a hotspot.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can achieve more accurate design alignment to an image by improved PDA target selection strategies. Better design alignment can provide better care area position accuracy, which can help provide improved sensitivity and nuisance suppression. Better design alignment also can provide tighter care area borders, which can reduce nuisance and improve sensitivity. Better targets for alignment can provide higher defect location accuracy and correct binning in design.

In the embodiments disclosed herein, PDA targets can be selected based on critical inspection areas. Image projections and a filter to remove repeating patterns can be used for target selection. Target selection also can be based on design content. Areas in an image overlapping with some design layers can be ignored. Besides reducing care areas size, these techniques can improve sensitivity.

Figure 4:
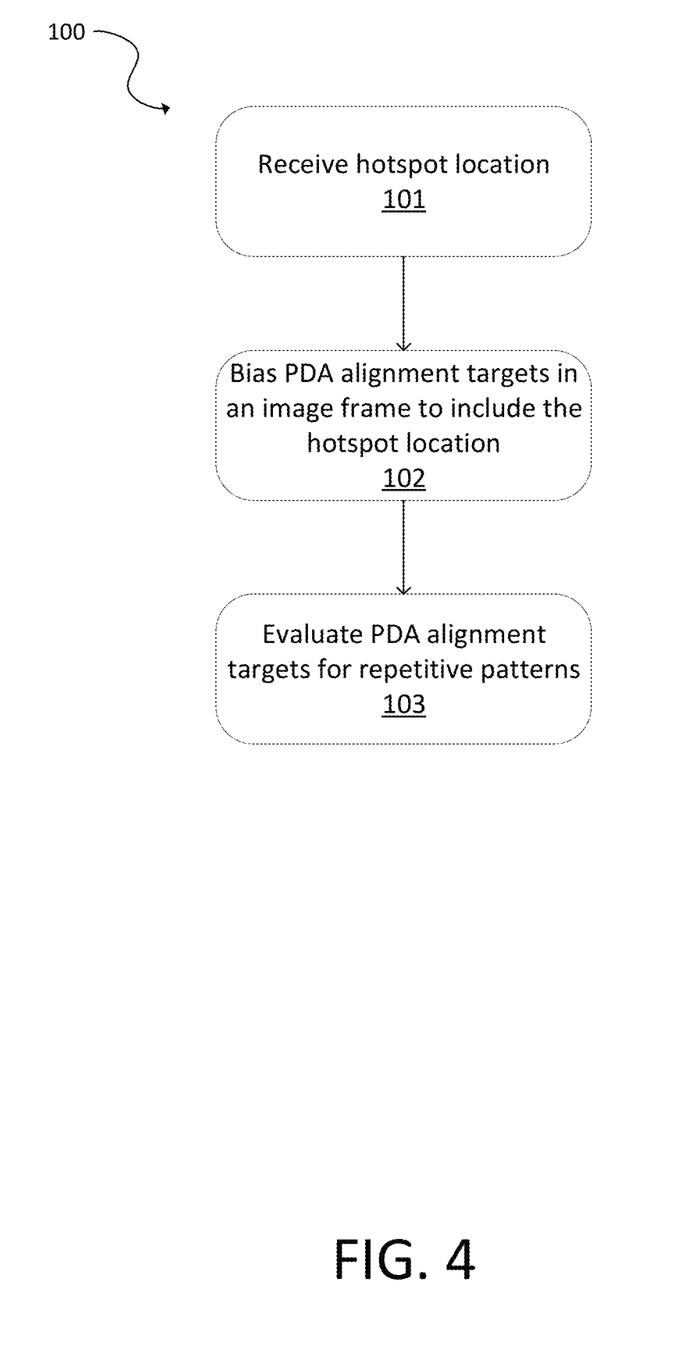
FIG. 4 is a flowchart of a first method embodiment in accordance with the present disclosure.

FIG. 4 is a flowchart of a first method 100. Some or all of the steps of the method 100 may be performed using a processor.

At 101, one or more hotspot locations are received at a processor. Semiconductor manufacturers can provide a hotspot care area location file, which can contain coordinates of hotspot locations. The hotspot locations also can be provided in other manners. For example, other tools can generate hotspot locations. In another example, the design file for the semiconductor device can be analyzed to provide hotspot locations.

The PDA targets in an image frame of a die are biased at 102 to include the hotspot location in one of the PDA targets. The image frame may be divided into multiple regularly-sized blocks. For example, the image frame may be divided into twenty-five of the regularly-sized blocks in a 5×5 array. Some or all of the PDA targets can include a hotspot. The method 100 can try to find a PDA target that contains a hotspot or the method 100 can try to place the PDA target near a hotspot.

The hotspot may be in the center of the PDA target, at the edge of the PDA target, or between the center and edge of the PDA target. In an instance, the hotspot may be centered at a center of the PDA target. In another instance, a majority of hotspots in a block are approximately centered in the PDA target.

The image frame and blocks can be configured as needed for a particular application. In an example, the image frame is 1500×780 pixels. This can be divided into an array of blocks having a 6×4 configuration. In another example, the image frame is 1000×1000 pixels. This can be divided into an array of blocks having a 5×5 configuration. Additional blocks or different arrays of blocks can be used for a particular application.

If there are fewer hotspots than PDA targets in a frame, other PDA targets can be positioned based on image-based selection.

If there are more hotspots than PDA targets in a frame, then covering the largest density of hotspots or the largest number of hotspots with PDA targets may be attempted.

In certain situations, the method 100 does not bias the PDA targets toward one or more of the hotspots. For example, the design at the hotspot location may not be available or the design may not be aligned to the image. In such examples, the method 100 may not bias the PDA targets or may fail to bias the PDA targets.

At 103, the PDA targets are evaluated for repetitive patterns. The can reduce or eliminate a number of repetitive targets in a database. Repetitive patterns may not be helpful for alignment by more than a repetition period. If the PDA targets do not contain repetitive patterns, then the PDA targets may be inspected. If the PDA targets contain only repetitive patterns, then the method 200 optionally may be performed.

Figure 5:
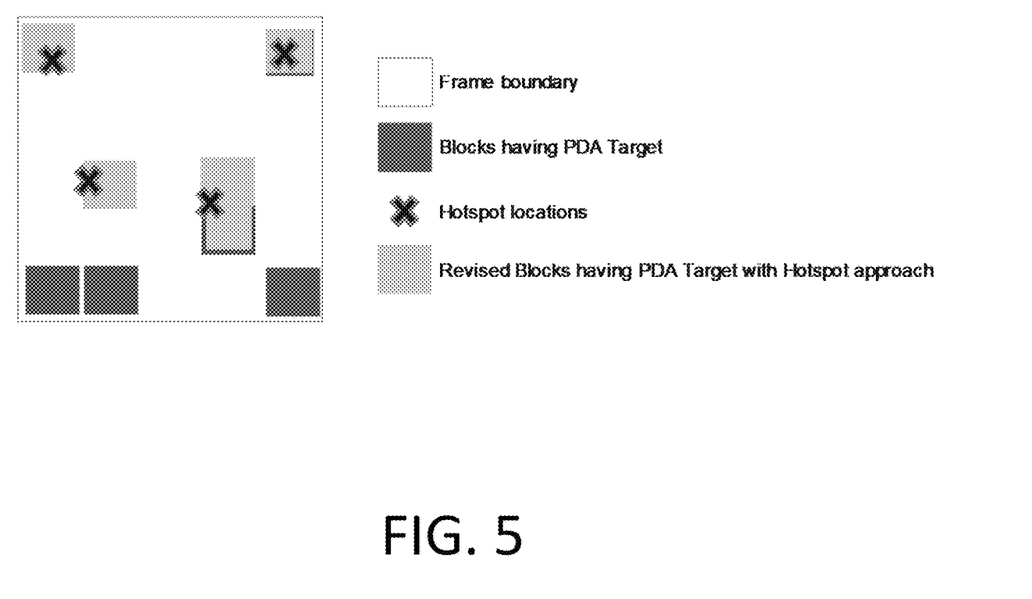
FIG. 5 is an exemplary frame of a die with PDA targets using the first method of FIG. 4.

FIG. 5 is an exemplary frame of a die with PDA targets using the first method of FIG. 4. The operation to find PDA targets in FIG. 5 is guided by the hotspot care areas defined by the user (e.g., the semiconductor manufacturer). The target find operation can attempt to find a good target in the close vicinity of the hotspots inside a frame. Even though it might not be the best target in the frame from the target selection criteria perspective, it is still the best target from the overall inspection sensitivity perspective.

In FIG. 5, the blocks with PDA targets will be changed based on the hotspot locations to the ones labeled "Revised Blocks." Thus, the Revised Blocks are biased toward the hotspot locations. Placing hotspots in the PDA targets can result in zero PDA alignment errors for these hotspot care areas.

The PDA targets, which are biased toward the hotspot locations, can then be inspected. The inspection can be performed by an inspection tool, such as an SEM. Defect detection is provided with improved sensitivity.

Using the method 100, the number of PDA targets found in a frame can be dynamically controlled by finding fewer targets in frames that do not have hotspots and more targets on frames that have more hotspot care areas. The method 100 also can improve overall PDA quality for inspection.

Increasing care area size may not be acceptable for new design nodes. Previously, care area size was increased to account for uncertainty by about one pixel for low PDA quality defects. With 7 nm, 5 nm, or newer design nodes, the increase in care area may result in loss of sensitivity.

Instead, design alignment is used at places with critical patterns rather than salient locations across a die. Semiconductor manufacturers often know where critical areas are and can provide this information in the form of care areas. Care areas can be used for target selection using the method 100.

The method 100 also can potentially avoid the PDA targets at specific areas in design where semiconductor manufacturers do not care. It is also possible to limit PDA target selection and not to use certain areas because these areas are not good for alignment based on design. Semiconductor manufacturers or other operators may have experience about what areas of alignment could not be performed even though a design is available. By avoiding these areas from PDA target selection, then other targets can be used.

Isolated corners in the image based on the horizontal and vertical projections can be provided. Transitions in both projections can be indications of a corner of the image. The cross points of these transitions may be marked and evaluated for design alignment.

It may be beneficial if PDA targets are unique. Otherwise, the system may use or focus on the wrong target. For example, uniqueness in a 1 μm range or less may be used (e.g., 20 pixels).

Figure 6:
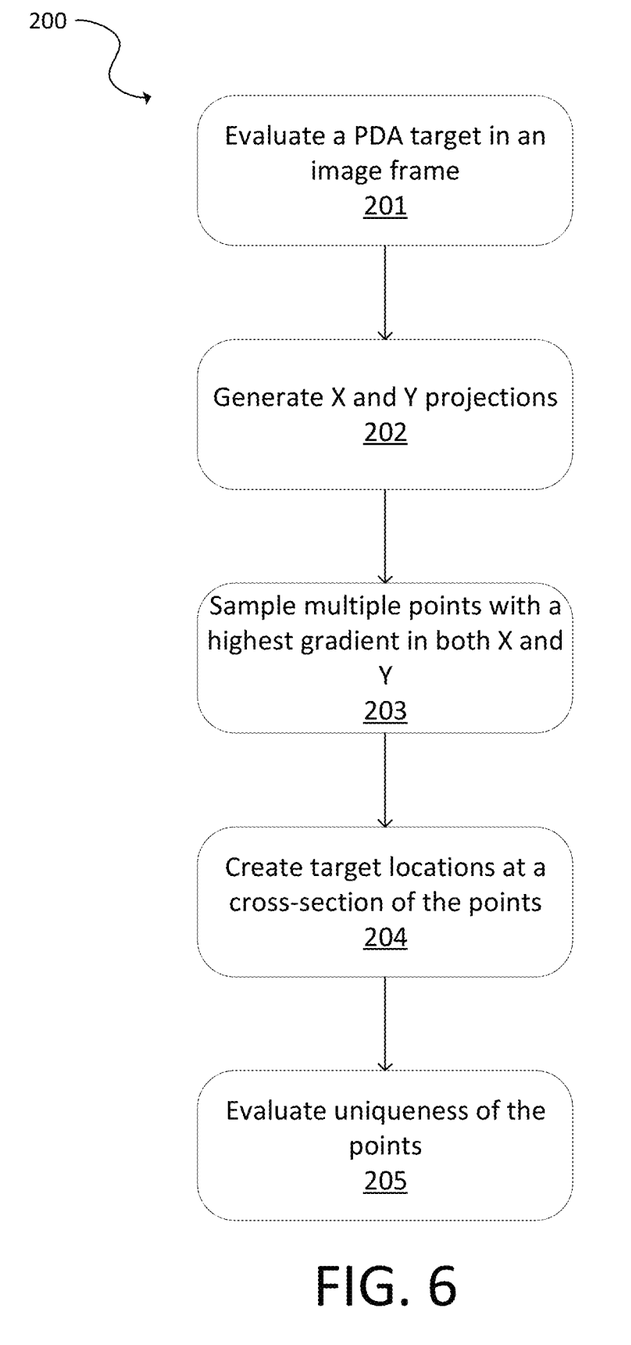
FIG. 6 is a flowchart of a second method embodiment in accordance with the present disclosure.

Using certain image based or frequency domain filters to avoid target selection at repeating areas where the alignment becomes easily confused is described in the method 200 of FIG. 6. Some or all of the steps of the method 200 may be performed using a processor.

At 201, a PDA target in an image frame is evaluated for repetitive patterns. A repetitive patterns may be a pattern that repeats at a period of less than a search range (e.g., one micron). This pattern may have 90% or greater similarity to be considered repeating. This can be the step 103 of method 100 or can be performed separately. The PDA target includes at least one hotspot location.

X and Y projections (e.g., X and Y axes) on the image frame are generated at 202.

A plurality of points with a highest gradient in both X and Y are sampled at 203. This can include one point for each combination of highest gradients in the X and Y. Thus, if there are three in X and two in Y, then there will be six points. For example, three sample points with the highest gradient in both X and Y are sampled.

Target locations (e.g., PDA targets) are created at a cross-section of the points at 204. The cross-section can be an intersection location on the image from the sample points.

Uniqueness of the points is evaluated at 205. Each target can be correlated with a search range (e.g., one micron) and the difference between first correlation peak and the second correlation peak can be treated as uniqueness. The larger the difference, then the greater the uniqueness. The points can be used as PDA targets if the points are unique. If the points are not unique, the image frame can be filtered with adaptive Fourier filtering using the processor. The points with a maximum intensity may then be selected as the PDA targets.

Figure 7:
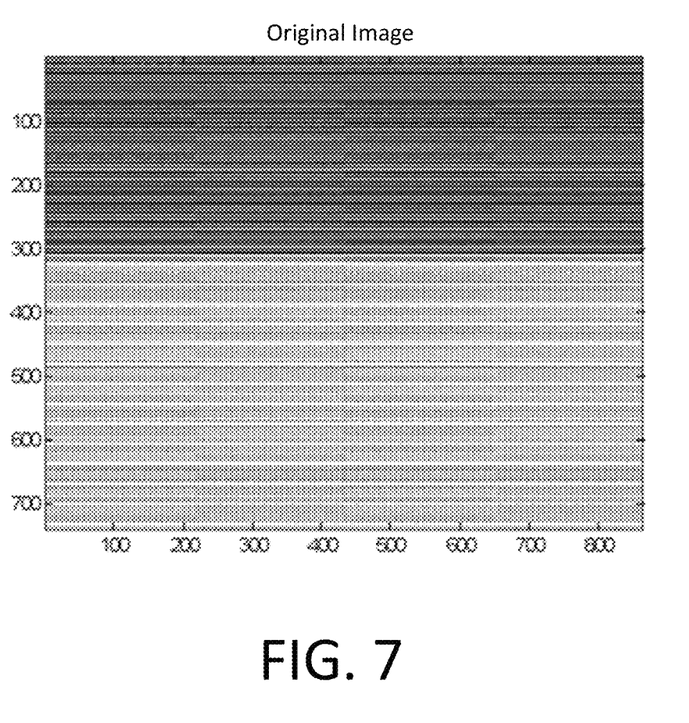
FIG. 7 is an exemplary image.

Regarding frequency domain filtering to find non-repetitive targets, existing algorithms typically do not find any unique targets in FIG. 7. In an embodiment, repeating patterns can be removed using adaptive Fourier filtering. The top of FIG. 7 is without a Fourier filter and the bottom is after a Fourier filter is applied. The bottom will provide a better PDA target.

A band pass filter can be applied. This band pass filter is chosen adaptively to suppress high frequency content. Low frequency content can also be removed.

Targets selected on this filtered image as the intensity maximums can be unique targets.

Using variable-sized targets such that the secondary peak is smaller than the primary correlation peak can improve the alignment. If a fixed size is used, then a unique small target may be polluted by noise around it. When the target is small and centered, then it may have a better uniqueness score.

The method 200 can optionally be used after the method 100.

Figure 8:
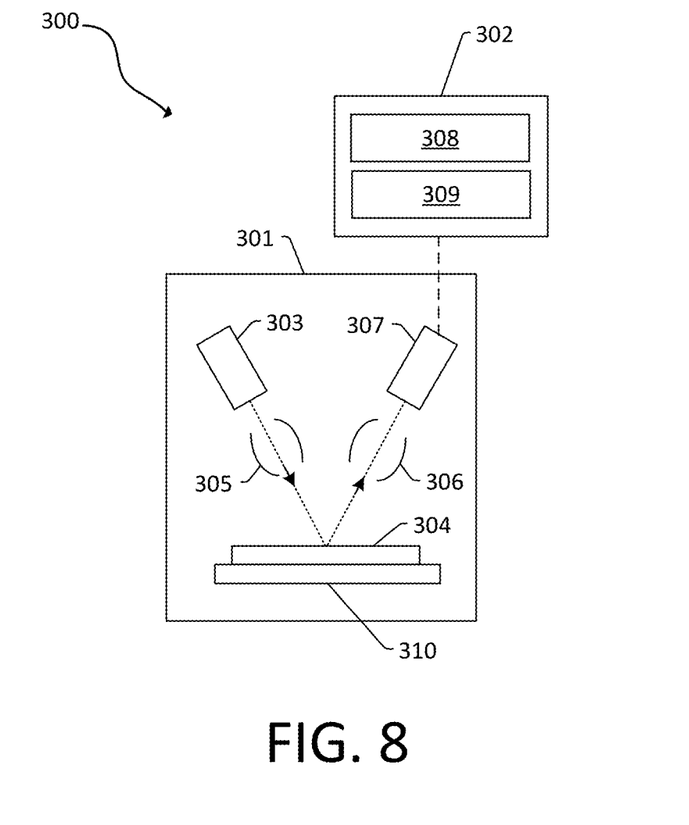
FIG. 8 is a block diagram of an embodiment of a system in accordance with the present disclosure.

FIG. 8 is a block diagram of an embodiment of a system 300. The system 300 includes a wafer inspection tool (which includes the electron column 301) configured to generate images of a wafer 304.

The wafer inspection tool includes an output acquisition subsystem that includes at least an energy source and a detector. The output acquisition subsystem may be an electron beam-based output acquisition subsystem. For example, in one embodiment, the energy directed to the wafer 304 includes electrons, and the energy detected from the wafer 304 includes electrons. In this manner, the energy source may be an electron beam source. In one such embodiment shown in FIG. 8, the output acquisition subsystem includes electron column 301, which is coupled to computer subsystem 302. A stage 310 may hold the wafer 304.

As also shown in FIG. 8, the electron column 301 includes an electron beam source 303 configured to generate electrons that are focused to wafer 304 by one or more elements 305. The electron beam source 303 may include, for example, a cathode source or emitter tip. The one or more elements 305 may include, for example, a gun lens, an anode, a beam limiting aperture, a gate valve, a beam current selection aperture, an objective lens, and a scanning subsystem, all of which may include any such suitable elements known in the art.

Electrons returned from the wafer 304 (e.g., secondary electrons) may be focused by one or more elements 306 to detector 307. One or more elements 306 may include, for example, a scanning subsystem, which may be the same scanning subsystem included in element(s) 305.

The electron column 301 also may include any other suitable elements known in the art.

Although the electron column 301 is shown in FIG. 8 as being configured such that the electrons are directed to the wafer 304 at an oblique angle of incidence and are scattered from the wafer 304 at another oblique angle, the electron beam may be directed to and scattered from the wafer 304 at any suitable angles. In addition, the electron beam-based output acquisition subsystem may be configured to use multiple modes to generate images of the wafer 304 (e.g., with different illumination angles, collection angles, etc.). The multiple modes of the electron beam-based output acquisition subsystem may be different in any image generation parameters of the output acquisition subsystem.

Computer subsystem 302 may be coupled to detector 307 as described above. The detector 307 may detect electrons returned from the surface of the wafer 304 thereby forming electron beam images of the wafer 304. The electron beam images may include any suitable electron beam images. Computer subsystem 302 may be configured to perform any of the functions described herein using the output of the detector 307 and/or the electron beam images. Computer subsystem 302 may be configured to perform any additional step(s) described herein. A system 300 that includes the output acquisition subsystem shown in FIG. 8 may be further configured as described herein.

It is noted that FIG. 8 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 8 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 302 includes a processor 308 and an electronic data storage unit 309. The processor 308 may include a microprocessor, a microcontroller, or other devices.

The computer subsystem 302 may be coupled to the components of the system 300 in any suitable manner (e.g., via one or more transmission media, which may include wired and/or wireless transmission media) such that the processor 308 can receive output. The processor 308 may be configured to perform a number of functions using the output. The wafer inspection tool can receive instructions or other information from the processor 308. The processor 308 and/or the electronic data storage unit 309 optionally may be in electronic communication with another wafer inspection tool, a wafer metrology tool, or a wafer review tool (not illustrated) to receive additional information or send instructions.

The processor 308 is in electronic communication with the wafer inspection tool, such as the detector 307. The processor 308 may be configured to process images generated using measurements from the detector 307. For example, the processor may perform embodiments of the method 100 or method 200.

In an instance, the processor 308 is configured to receive a hotspot location; bias pattern-to-design alignment targets in an image frame of a die of the wafer to include the hotspot location in one of the pattern-to-design alignment targets; and evaluate the pattern-to-design alignment targets for repetitive patterns. The image frame can be divided into a plurality of regularly-sized blocks, such as twenty five blocks in a 5×5 array. In an embodiment, all the pattern-to-design alignment targets include a hotspot.

In an instance, the processor 308 is further configured to generate X and Y projections on the image frame; sample a plurality of points with a highest gradient in both X and Y; create target locations at a cross-section of the points; and evaluate uniqueness of the points, wherein the points are used as the pattern-to-design alignment targets. If the points are not unique, the processor can be further configured to filter the image frame with adaptive Fourier filtering. The processor may be further configured to select the points with maximum intensity as the pattern-to-design alignment targets.

The computer subsystem 302, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 308 and electronic data storage unit 309 may be disposed in or otherwise part of the system 300 or another device. In an example, the processor 308 and electronic data storage unit 309 may be part of a standalone control unit or in a centralized quality control unit. Multiple processors 308 or electronic data storage units 309 may be used.

The processor 308 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 308 to implement various methods and functions may be stored in readable storage media, such as a memory in the electronic data storage unit 309 or other memory.

If the system 300 includes more than one computer subsystem 302, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 308 may be configured to perform a number of functions using the output of the system 300 or other output. For instance, the processor 308 may be configured to send the output to an electronic data storage unit 309 or another storage medium. The processor 308 may be further configured as described herein.

The processor 308 or computer subsystem 302 may be part of a defect review system, an inspection system, a metrology system, or some other type of system. Thus, the embodiments disclosed herein describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 308 may be configured according to any of the embodiments described herein. The processor 308 also may be configured to perform other functions or additional steps using the output of the system 300 or using images or data from other sources.

The processor 308 may be communicatively coupled to any of the various components or sub-systems of system 300 in any manner known in the art. Moreover, the processor 308 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 308 and other subsystems of the system 300 or systems external to system 300.

Various steps, functions, and/or operations of system 300 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 308 (or computer subsystem 302) or, alternatively, multiple processors 308 (or multiple computer subsystems 302). Moreover, different sub-systems of the system 300 may include one or more computing or logic systems. Therefore, the above description should not be interpreted as a limitation on the present disclosure but merely an illustration.

Each of the steps of the methods may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   receiving a hotspot location at a processor;
   biasing, using the processor, a placement of pattern-to-design alignment targets in one of a plurality of blocks in an image frame of a die using a design file such that the pattern-to-design alignment targets include the hotspot location in one of the pattern-to-design alignment targets, wherein the biasing includes moving at least one of the pattern-to-design alignment targets from one of the blocks without the hotspot location to one of the blocks with the hotspot location;

evaluating, using the processor, the pattern-to-design alignment targets for repetitive patterns, and reducing a care area size based on the pattern-to-design alignment target with the hotspot location.

2. The method of claim 1, wherein the blocks are regularly-sized.

3. The method of claim 2, wherein the image frame is divided into twenty-five of the regularly-sized blocks.

4. The method of claim 1, wherein the evaluating includes:

generating, using the processor, X and Y projections on the image frame;

sampling, using the processor, a plurality of points with a highest gradient in both X and Y;

creating, using the processor, target locations at a cross-section of the points; and evaluating, using the processor, uniqueness of the points.

5. The method of claim 4, wherein the points are not unique, and wherein the method further comprises filtering the image frame with adaptive Fourier filtering using the processor.

6. The method of claim 5, further comprising selecting, using the processor, the points with maximum intensity as the pattern-to-design alignment targets.

7. The method of claim 1, wherein all the pattern-to-design alignment targets include a hotspot.

8. The method of claim 1, wherein the hotspot location is in a hotspot care area location file.

9. A non-transitory computer readable medium storing a program configured to instruct a processor to execute the method of claim 1.

10. A non-transitory computer readable medium storing a program configured to instruct a processor to execute the method of claim 4.

11. A system comprising:
a stage that holds a wafer;
an electron beam source that directs an electron beam at the wafer;
a detector configured to receive the electron beam reflected from the wafer; and
a processor in electron communication with the detector, wherein the processor is configured to:
receive a hotspot location;
bias a placement of pattern-to-design alignment targets in one of a plurality of blocks in an image frame of a die of the wafer using a design file such that the pattern-to-design alignment targets include the hotspot location in one of the pattern-to-design alignment targets, wherein the bias includes moving at least one of the pattern-to-design alignment targets from one of the blocks without the hotspot location to one of the blocks with the hotspot location;
evaluate the pattern-to-design alignment targets for repetitive patterns;
and reduce a care area size based on the pattern-to-design alignment target with the hotspot location.

12. The system of claim 11, wherein the blocks are regularly-sized.

13. The system of claim 12, wherein the image frame is divided into twenty-five of the regularly-sized blocks.

14. The system of claim 11, wherein evaluating the pattern-to-design alignment targets for the repetitive patterns includes:

generating X and Y projections on the image frame;

sampling a plurality of points with a highest gradient in both X and Y;

creating target locations at a cross-section of the points; and evaluating uniqueness of the points.

15. The system of claim 14, wherein the points are not unique, and wherein the processor is further configured to filter the image frame with adaptive Fourier filtering.

16. The system of claim 15, wherein the processor is further configured to select the points with maximum intensity as the pattern-to-design alignment targets.

17. The system of claim 11, wherein all the pattern-to-design alignment targets include a hotspot.

18. The system of claim 11, wherein the hotspot location is in a hotspot care area location file.

* * * * *